United States Patent
Wake

(10) Patent No.: US 6,757,203 B2
(45) Date of Patent: Jun. 29, 2004

(54) SEMICONDUCTOR STORAGE DEVICE

(75) Inventor: Hiroki Wake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/339,085

(22) Filed: Jan. 9, 2003

(65) Prior Publication Data
US 2003/0147276 A1 Aug. 7, 2003

(30) Foreign Application Priority Data
Feb. 1, 2002 (JP) .................................... 2002-025639

(51) Int. Cl.[7] .............................. G11C 16/04; G11C 7/00
(52) U.S. Cl. .................................. 365/189.09; 365/226
(58) Field of Search ........................... 365/189.09, 226, 365/185.18, 185.23; 327/535, 313

(56) References Cited

U.S. PATENT DOCUMENTS 5,642,072 A * 6/1997 Miyamoto et al. .......... 327/535
5,898,335 A * 4/1999 Miyamoto et al. .......... 327/535
6,266,276 B1 * 7/2001 Odani .................... 365/185.18

* cited by examiner

Primary Examiner—Anh Phung
(74) Attorney, Agent, or Firm—Adams & Wilks

(57) ABSTRACT

The semiconductor storage device includes: a booster circuit (12) for boosting a power supply voltage (11) supplied to the IC; and a limiter circuit (13) having a function of performing voltage limitation of a high voltage which is a booster circuit output. The limiter circuit 13 selects one voltage value from two values based on whether it is a data recording/erasing time or an evaluation time, to output the one to the memory circuit block 14.

12 Claims, 2 Drawing Sheets

SEMICONDUCTOR STORAGE DEVICE

BACKGROUND OF THE INVENTION

1. Field of the Invention

This invention relates to a semiconductor storage device which is electrically rewritable.

2. Description of the Related Art

A nonvolatile memory, which is electrically writable and erasable, generally employs a structure which includes a recording transistor provided with a floating gate under a gate and a selecting transistor connected to the recording transistor. The floating gate has a structure in which electrically insulated electrodes are provided. In the structure, when a high voltage is applied to a drain and a gate, it is possible to store (write) an electron in the floating gate or to emit (erase) the electron stored in the floating gate.

A high voltage required in writing or erasing is generally about 20 V. As the high voltage, an optimum voltage is supplied such that a high voltage outputted by a booster circuit provided inside an IC is limited in a voltage by a limiter circuit so as not to be equal to or higher than a predetermined voltage to execute writing or erasing of data to the recording transistor.

Up to now, the limiter circuit outputs by one value a high voltage for executing writing or erasing of data to the recording transistor, and uses a surface breakdown voltage characteristic of a high withstand voltage MOS transistor.

A surface breakdown voltage of the high withstand voltage MOS transistor is generally about 20 V, and thus being most suitable for a voltage required for writing or erasing of data to the recording transistor.

For the purpose of measuring, for example, as an inspection before shipment of a product, electric characteristics of the recording transistor and the selecting transistor adapted to the recording transistor, a voltage is applied to the recording transistor and the selecting transistor. As the voltage required for this purpose, there is used a power supply voltage supplied from the outside of the IC or the limiter circuit output voltage for executing writing/erasing of data to the recording transistor.

Up to now, the limiter circuit is a circuit which supplies by one value a high voltage required for writing/erasing of data to the recording transistor. The high voltage supplied to the recording transistor and the selecting transistor adapted to the recording transistor uses an output of one value outputted in the limiter circuit in any purposes such as execution of writing/erasing of data to the recording transistor and execution of electric characteristic evaluation of the recording transistor and the selecting transistor.

The nonvolatile memory, which is electrically writable and erasable, is composed of the recording transistor provided with the floating gate under the gate and the selecting transistor adapted to the recording transistor. A gate of the selecting transistor is connected to a gate of the selecting transistor of a plurality of bits and is also used as a word line. In the word line, there is used polysilicon wiring in many cases. Below the polysilicon wiring, a poly-gate field transistor is formed and a source/drain of the poly-gate field transistor serves as a diffusion layer of the source/drain of the selecting transistor of the adjoining bit.

A reverse voltage of the poly-gate field transistor is designed so as to be higher than the high voltage supplied by the limiter circuit output, and therefore the poly-gate field transistor is not turned on.

However, semiconductor manufacturing process has progressed in miniaturization, so that it is difficult to increase a reverse voltage of the poly-gate field transistor.

The reverse voltage of the poly-gate field transistor is greatly influenced by a channel length of the poly-gate field transistor, that is, the distance from the diffusion layer of the source/drain of the adjoining selecting transistor. In recent miniaturizing process, this distance is shortened and the reverse voltage is further lowered. When the high voltage supplied by the limiter circuit output is higher than the reverse voltage of the poly-gate field transistor, the poly-gate field transistor is turned on. Therefore, there arises such a potential state that the bit line of the adjoining bit is short-circuited, resulting in a problem. To a gate of the poly-gate field transistor as the word line, at the time of writing/erasing of data to the recording transistor, a high voltage supplied by the limiter circuit output is applied, and then the transistor is turned on. However, since the source/drain of the adjoining selecting transistor as the source/drain both have the same potential or a high impedance, no current flows, resulting in no problem.

However, when the electric characteristics of the recording transistor and the selecting transistor are evaluated, the source/drain of the adjoining selecting transistor do not necessarily have the same potential, which causes a problem in that the electric characteristics can not be evaluated.

SUMMARY OF THE INVENTION

In order to solve the above-mentioned problems, the present invention has been made and has an object to provide a semiconductor storage device capable of outputting a high voltage supplied by a limiter circuit output as two values consisting of: a high voltage for executing writing/erasing of data to a recording transistor; and a high voltage for evaluating, as inspection before shipment of a product, for example, electric characteristics of the recording transistor and a selecting transistor, and of selectively outputting one voltage value out of the two values from the limiter circuit in synchronism with a signal generated by a timing circuit inside an IC or a signal given inside the IC via a terminal from the outside of the IC. In order to attain such object of the invention, the following measures are taken.

According to the present invention, there is provided a semiconductor storage device which is electrically writable and erasable, including: a booster circuit for boosting a power supply voltage supplied to an IC; and a limiter circuit having a function of performing voltage limitation of a high voltage which is a booster circuit output so as not to be boosted to a predetermined voltage or more, characterized in that the limiter circuit is capable of outputting two values of high voltage and the circuit is capable of selecting one voltage value out of the two values in synchronism with a signal generated by a timing circuit inside the IC or a signal given inside the IC via the terminal from the outside of the IC, to output the one of two voltage values.

According to the present invention, the high voltage which can be outputted from the limiter circuit is composed of two potentials having different voltage values, consisting of a high voltage for executing writing/erasing of data to the recording transistor and a high voltage for evaluating electric characteristics of the recording transistor and the selecting transistor.

The former high voltage for executing writing/erasing of data to the recording transistor is a voltage which is higher than a reverse voltage of a poly-gate field transistor formed on a word line, and which is required to move an electron to a floating gate provided in the recording transistor.

The latter high voltage for evaluating the electric characteristics of the recording transistor and the selecting transistor is a voltage which is lower than the reverse voltage of the poly-gate field transistor formed on the word line, and which does not turn on the poly-gate field transistor even if the high voltage is applied to the word line.

By switching those two high voltages according to the purpose thereof, it is possible to realize the proper function with respect to any operation of the IC.

According to the present invention, the limiter circuit that can output two kinds of high voltages, which are capable of being selectively switched, includes a high withstand voltage MOS transistor and a low withstand voltage MOS transistor, and which uses a difference between the withstand voltages of surface breakdown voltages of the respective MOS transistors.

The limiter circuit can output two values of the high voltages obtained by the two MOS transistor characteristics having different withstand voltages, and performs voltage limitation by connecting one of MOS transistors to an output of the booster circuit in synchronism with the signal generated by the timing circuit inside the IC or the signal given inside the IC via the terminal from the outside of the IC.

There is employed a circuit structure in which a switch adapted to the high withstand voltage MOS transistor can be eliminated. With this structure, it is possible to contribute to layout saving. The limiter circuit output voltage is determined by a surface breakdown characteristic of the high withstand MOS transistor by closing a switch of the low withstand voltage MOS transistor. On the contrary, when the switch is turned on, the output of the booster circuit is connected with the low withstand voltage MOS transistor and the high withstand voltage MOS transistor. However, since the limiter circuit output voltage is determined by the lower withstand voltage, it is determined by a surface breakdown characteristic of the low withstand MOS transistor.

There is also employed a circuit structure in which a switch adapted to the low withstand voltage MOS transistor can be eliminated. With this structure, it is possible to contribute to further layout saving. The high withstand voltage MOS transistor has a structure which also serves as the switch of the low withstand voltage MOS transistor. In the case where the high withstand voltage MOS transistor is opened, the limiter circuit output voltage is determined by the surface breakdown characteristic of the low withstand voltage MOS transistor. In the case where the high withstand voltage MOS transistor is closed, it is possible to perform voltage limitation thereof by the surface breakdown characteristic of the transistor itself.

DESCRIPTION OF THE PREFERRED EMBODIMENT

Hereinafter, embodiments in accordance with the present invention will be described in detail with reference to the drawings.

Figure 1:
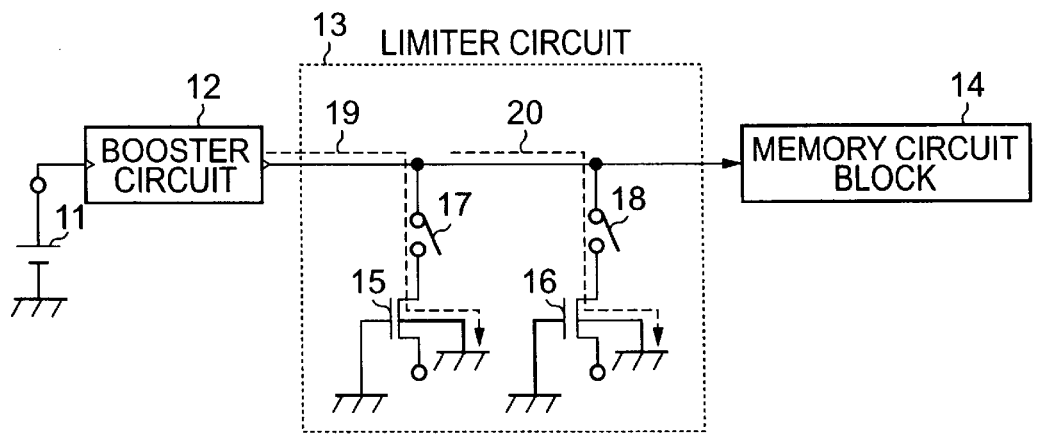
FIG. 1 is a diagram showing a structure of a limiter circuit and a circuit block which inputs and outputs a voltage to and from the limiter circuit in accordance with Embodiment 1 of the present invention.

FIG. 1 is a diagram showing a structure of a limiter circuit and a circuit block which inputs and-outputs a voltage to and from the limiter circuit in accordance with Embodiment 1 of the present invention.

A power supply voltage 11 inputted from the outside of an IC is boosted up to a voltage sufficiently high with respect to writing/erasing of data to a recording transistor constituted in a memory circuit block 14 by a booster circuit 12 provided inside the IC. A high voltage outputted by the booster circuit 12 is inputted to a limiter circuit 13, where the voltage is limited in voltage so as not to be predetermined voltage or more. Then, the voltage is sent to the memory circuit block 14. The memory circuit block 14 is a circuit block composed of the recording transistor described before and a selecting transistor connected to the recording transistor.

The limiter circuit 13 is comprised of a low withstand voltage MOS transistor 15 and a switch 17 connected to the low withstand voltage MOS transistor, and a high withstand voltage MOS transistor 16 and a switch 18 connected to the high withstand voltage MOS transistor. The switch 17 for the low withstand voltage MOS transistor and the switch 18 for the high withstand voltage MOS transistor are opened and closed based on whether it is a product use time or, for example, an inspection time before shipment of the product, by a signal generated by a timing circuit provided inside the IC or a timing signal inputted from the outside of the IC, and can connect either of the low withstand voltage MOS transistor 15 or the high withstand voltage MOS transistor 16.

In the case where writing/erasing of data to the recording transistor is being executed, the switch 17 is turned off and the switch 18 is turned on. In this case, a high voltage output by the booster circuit 12 is connected to a drain of the high withstand voltage MOS transistor 16, and is not connected to the low withstand voltage MOS transistor 15. Since a gate of the high withstand voltage MOS transistor 16 is connected to ground, a surface breakdown characteristic of the high withstand MOS transistor is utilized to generate a voltage limit path in a path of a current path 20. Thus, an output of the booster circuit 12 can be limited in voltage by a surface breakdown voltage of the high withstand voltage MOS transistor. The surface breakdown of the high withstand voltage MOS transistor is generally about 20 V and it is possible to execute writing/erasing of data to the recording transistor in the memory circuit block 14.

In the case where electric characteristics of the recording transistor and the selecting transistor are being evaluated, the switch 17 is turned on and the switch 18 is turned off. In this case, a high voltage output by the booster circuit 12 is connected to a drain of the low withstand voltage MOS transistor 15 and is not connected to the high withstand voltage MOS transistor 16. Since a gate of the low withstand voltage MOS transistor 15 is connected to ground, a surface breakdown characteristic of the low withstand voltage MOS transistor is utilized to generate a voltage limit path in a path of a current path 19. Thus, an output of the booster circuit 12 can be limited in voltage by a surface breakdown voltage of the low withstand voltage MOS transistor. The surface breakdown of the low withstand voltage MOS transistor is generally about 10 V and it is possible to supply a high voltage lower than a reverse voltage of the poly-gate field transistor to the memory circuit block 14.

By adopting a structure of the limiter circuit described in detail in Embodiment 1 of the present invention, it is possible to selectively supply the two values of high voltage to the memory circuit block.

Figure 2:
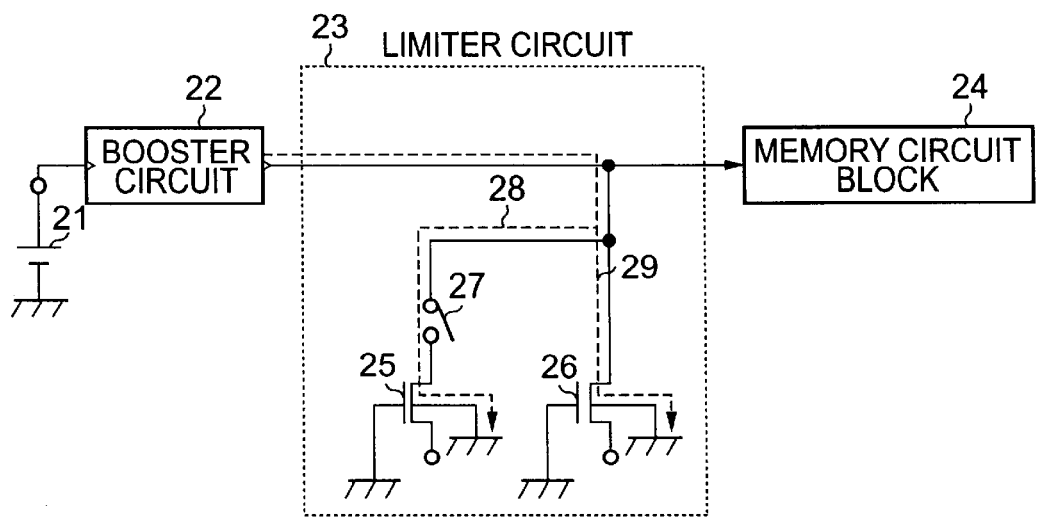
FIG. 2 is a diagram showing a structure of a limiter circuit and a circuit block which inputs and outputs a voltage to and from the limiter circuit in accordance with Embodiment 2 of the present invention.

Next, an explanation is made of Embodiment 2. FIG. 2 is a diagram showing a structure of a limiter circuit and a circuit block which inputs and outputs a voltage to and from the limiter circuit in accordance with Embodiment 2 of the present invention.

A power supply voltage 21 inputted from the outside of an IC is boosted up to a voltage sufficiently high with respect to writing/erasing of data to a recording transistor constituted in a memory circuit block 24 by a booster circuit 22 provided inside the IC. A high voltage outputted by the booster circuit 22 is inputted to a limiter circuit 23, where the voltage limitation is performed so as not for the voltage boosted up to a predetermined voltage or more. Then, the voltage is sent to the memory circuit block 24. The memory circuit block 24 is a circuit block composed of the recording transistor described before and a selecting transistor adapted to the recording transistor.

The limiter circuit 23 is constituted by a low withstand voltage MOS transistor 25 and a switch 27 adapted to the low withstand voltage MOS transistor, and a high withstand voltage MOS transistor 26. The switch 27 for the low withstand voltage MOS transistor is opened and closed, based on whether it is a product use time or, for example, the inspection time before shipment of the product, by a signal generated by a timing circuit provided inside the IC or a timing signal inputted from the outside of the IC.

In the case where there is executed writing/erasing of data to the recording transistor, the switch 27 is turned off. In this case, a high voltage outputted by the booster circuit 22 is connected to a drain of the high withstand voltage MOS transistor 26, and is not connected to the low withstand voltage MOS transistor 25.

Here, since a gate of the high withstand voltage MOS transistor 26 is connected to a ground, a surface breakdown characteristic of the high withstand MOS transistor is utilized to generate a voltage limit path in a path of a current path 29. Thus, an output of the booster circuit 22 can be limited in voltage by a surface breakdown voltage of the high withstand voltage MOS transistor. The surface breakdown of the high withstand voltage MOS transistor is generally about 20 V, and therefore the writing/erasing of data to the recording transistor in the memory circuit block 24 can be executed.

In the case where the electric characteristics of the recording transistor and the selecting transistor are evaluated, the switch 27 is turned on. In this case, a high voltage outputted by the booster circuit 22 is connected to a drain of the low withstand voltage MOS transistor 25 and the drain of the high withstand voltage MOS transistor 26. Since a gate of the low withstand voltage MOS transistor 25 and a gate of the high withstand voltage MOS transistor 26 are connected to a ground, there is generated a double system voltage limit path in a path of a current path 28 where a surface breakdown characteristic of the low withstand voltage MOS transistor is utilized and the path of the current path 29 where the surface breakdown characteristic of the high withstand voltage MOS transistor is utilized. In this case, there is ultimately determined by the current path whose surface breakdown voltage is lower. Thus, an output of the booster circuit 22 can be limited in voltage by a surface breakdown voltage of the low withstand voltage MOS transistor. The surface breakdown of the low withstand voltage MOS transistor is generally about 10 V and therefore a high voltage lower than the reverse voltage of the poly-gate field transistor can be supplied to the memory circuit block 24.

Note that, in this embodiment, there is provided one switch and a further simplified structure is taken in comparison with Embodiment 1.

Figure 3:
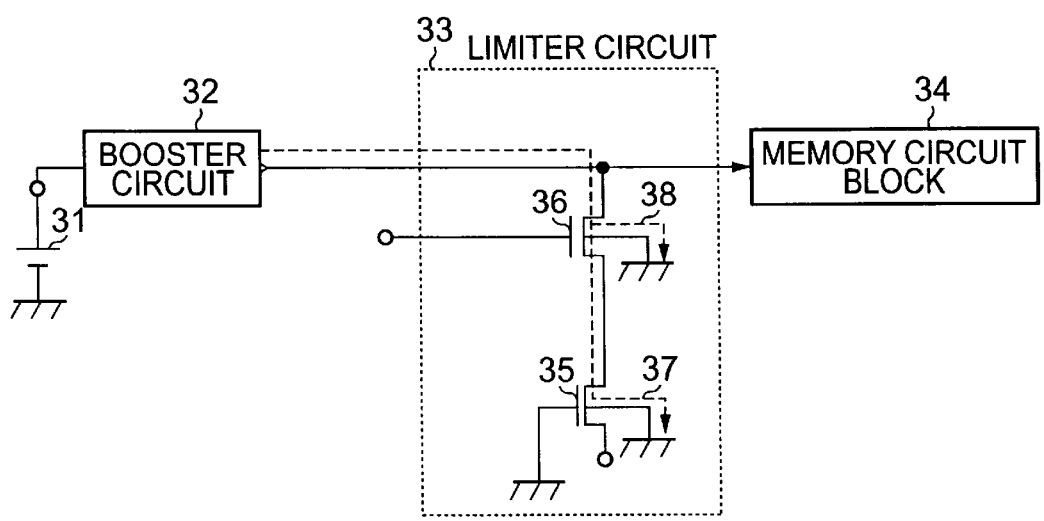
FIG. 3 is a diagram showing a structure of a limiter circuit and a circuit block which inputs and outputs a voltage to and from the limiter circuit in accordance with Embodiment 3 of the present invention.

Next, an explanation is made of Embodiment 3. FIG. 3 is a diagram showing a structure of a limiter circuit and a circuit block which inputs and outputs a voltage to and from the limiter circuit in accordance with Embodiment 3 of the present invention.

A power supply voltage 31 inputted from the outside of an IC is boosted up to a voltage sufficiently high with respect to writing/erasing of data to a recording transistor constituted in a memory circuit block 34 by a booster circuit 32 provided inside the IC. A high voltage outputted by the booster circuit 32 is inputted to a limiter circuit 33, where the voltage limitation is performed so as not for the voltage to be boosted up to a predetermined voltage or more. Then, the voltage is sent to the memory circuit block 34.

The memory circuit block 34 is a circuit block composed of the recording transistor described before and a selecting transistor adapted to the recording transistor.

The limiter circuit 33 is constituted by a low withstand voltage MOS transistor 35 and a high withstand voltage MOS transistor 36.

To a gate of the high withstand voltage MOS transistor 36, there is applied a signal generated by a timing circuit provided inside the IC or a timing signal inputted from the outside of the IC, based on whether it is the product use time or, for example, the inspection time before shipment of the product, to thereby open and close the transistor.

In the case where there is executed writing/erasing of data to the recording transistor, a ground is applied to the gate of the high withstand voltage MOS transistor 36 and the transistor is turned off. In this case, the high withstand voltage MOS transistor 36 is in the same state as those of the high withstand voltage MOS transistors 16 and 26 in Embodiments 1 and 2. Then, by a surface breakdown characteristic of the high withstand voltage MOS transistor 36, there is generated a voltage limit path in a path of a current path 38. Thus, an output of the booster circuit 32 can be limited in voltage by a surface breakdown voltage of the high withstand voltage MOS transistor. The surface breakdown of the high withstand voltage MOS transistor is generally about 20 V, and therefore writing/erasing of data can be executed to the recording transistor in the memory circuit block 24.

In the case where electric characteristics of the recording transistor and the selecting transistor are evaluated, the high withstand voltage MOS transistor 36 is turned on. In this case, a high voltage outputted by the booster circuit 32 is connected to a drain of the low withstand voltage MOS transistor 35. Since a gate of the low withstand voltage MOS transistor 35 is connected to a ground, there is generated a voltage limit path in a path of a current path 37 where a surface breakdown characteristic of the low withstand voltage MOS transistor is utilized. Thus, an output of the booster circuit 32 can be limited in voltage by a surface breakdown voltage of the low withstand voltage MOS transistor. The surface breakdown of the low withstand voltage MOS transistor is generally about 10 V, and therefore a high voltage lower than the reverse voltage of the poly-gate field transistor can be supplied to the memory circuit block 34.

Note that, in this embodiment, there is provided one switch and a further simplified structure is taken in comparison with Embodiment 1.

As has been described, the present invention is a limiter circuit which uses a difference between surface breakdown characteristics of the high withstand voltage MOS transistor and the low withstand voltage MOS transistor, and can selectively output one value out of the two values of high voltage.

As the process in miniaturization has progressed recently, the reverse voltage of the poly-gate field transistor formed below the word line disposed within the memory cell becomes low. In such a process, by switching these two high voltages according to the purpose, it is possible to realize the proper function with respect to any operation of the IC.

What is claimed is:

1. A semiconductor storage device which is electrically writable and erasable, comprising:
   a booster circuit for boosting an externally supplied power supply voltage and outputting a boosted voltage;
   a limiter circuit for receiving the boosted voltage and outputting a limited voltage; and
   a memory circuit block for receiving the limited voltage;
   wherein the limited voltage output by the limiter circuit comprises one of two values depending upon whether data recording/erasing to the memory circuit block is being performed or evaluation of the memory circuit block is being performed.

2. A semiconductor storage device according to claim 1; wherein the limiter circuit comprises a first MOS transistor and a second MOS transistor, and the limited voltage comprises one of a surface breakdown voltage of the first MOS transistor and a surface breakdown voltage of the second MOS transistor.

3. A semiconductor storage device according to claim 1; wherein the limiter circuit comprises a high withstand voltage MOS transistor, a low withstand voltage MOS transistor, and a switch for selecting the low withstand voltage MOS transistor when evaluation of the memory circuit block is being performed; wherein the limited voltage comprises a surface breakdown voltage of the high withstand voltage MOS transistor when data recording/erasing is being performed and a surface breakdown voltage of the low withstand voltage MOS transistor when data recording/erasing is being performed.

4. A semiconductor storage device according to claim 1; wherein the limiter circuit comprises a high withstand voltage MOS transistor and a low withstand voltage MOS transistor; wherein the limiter circuit outputs a surface breakdown voltage of the high withstand voltage MOS transistor when data recording/erasing is being performed and outputs a surface breakdown voltage of the low withstand voltage MOS transistor without breaking-down the high withstand voltage MOS transistor when evaluation of the memory circuit block is being performed.

5. A semiconductor storage device according to claim 1; wherein the memory circuit block comprises a recording transistor for storing data and a selecting transistor connected to the recording transistor for selecting the recording transistor.

6. A semiconductor storage device according to claim 5; wherein the recording transistor comprises a floating gate transistor.

7. A memory device comprising: a plurality of separately addressable memory cells for storing data; a booster circuit for boosting a power supply voltage and outputting a boosted voltage to a memory cell for writing data to the memory circuit cell or testing the memory cell; a voltage limiter circuit connected to an output of the booster circuit and to a timer circuit for limiting a boosted voltage output by the booster circuit to a first value when data is being written to or erased from the memory cell block and to a second value lower than the first value when the memory cell is being evaluated based on an output of the timer circuit.

8. A memory device according to claim 7; wherein the limiter circuit comprises a first MOS transistor and a second MOS transistor, the first value comprises a surface breakdown voltage of the first MOS transistor and the second value comprises a surface breakdown voltage of the second MOS transistor.

9. A memory device according to claim 7; wherein the limiter circuit comprises a high withstand voltage MOS transistor, a low withstand voltage MOS transistor, and a switch for selecting the low withstand voltage MOS transistor when evaluation of the memory cell is being performed; and wherein the limited voltage comprises a surface breakdown voltage of the high withstand voltage MOS transistor when data is being written to or erased from the memory dell and a surface breakdown voltage of the low withstand voltage MOS transistor when evaluation of the memory cell is being performed.

10. A memory device according to claim 7; wherein the limiter circuit comprises a high withstand voltage MOS transistor and a low withstand voltage MOS transistor; wherein the limiter circuit outputs a surface breakdown voltage of the high withstand voltage MOS transistor when data is being written to or erased from the memory cell and outputs a surface breakdown voltage of the low withstand voltage MOS transistor without breaking-down the high withstand voltage MOS transistor when evaluation of the memory cell is being performed.

11. A memory device according to claim 7; wherein the memory cells each comprise a recording transistor for storing data and a selecting transistor connected to the recording transistor for selecting the recording transistor.

12. A memory device according to claim 11; wherein the recording transistor is a floating gate transistor.

* * * * *